(12) United States Patent
Heo et al.

(10) Patent No.: US 8,101,980 B2
(45) Date of Patent: Jan. 24, 2012

(54) GRAPHENE DEVICE AND METHOD OF MANUFACTURING THE SAME

(75) Inventors: Jin-seong Heo, Suwon-si (KR); Sun-ae Seo, Hwaseong-si (KR); Dong-chul Kim, Suwon-si (KR); Yun-sung Woo, Suwon-si (KR); Hyun-jong Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,933

(22) Filed: Aug. 25, 2010

(65) Prior Publication Data

US 2011/0089995 A1  Apr. 21, 2011

(30) Foreign Application Priority Data

Oct. 16, 2009 (KR) .................. 10-2009-0098778

(51) Int. Cl.
*H01L 29/778* (2006.01)
*H01L 21/78* (2006.01)
*H01L 21/00* (2006.01)

(52) U.S. Cl. ............ 257/288; 257/327; 257/E21.051; 257/E21.049; 257/E21.041; 257/E29.297; 257/E29.246; 257/E29.082; 257/E29.068; 438/197

(58) Field of Classification Search .......... 257/288, 257/327, E21.051, E21.049, E21.041, E29.297, 257/E29.246, E29.082, E29.068; 438/197
See application file for complete search history.

(56) References Cited

U.S. PATENT DOCUMENTS

| | | | | |
|---|---|---|---|---|
| 7,755,395 | B2 * | 7/2010 | Yoshii et al. | 326/83 |
| 7,858,989 | B2 * | 12/2010 | Chen et al. | 257/76 |
| 2007/0187694 | A1 | 8/2007 | Pfeiffer | |
| 2009/0020764 | A1 | 1/2009 | Anderson et al. | |
| 2009/0140801 | A1 | 6/2009 | Ozyilmaz et al. | |
| 2009/0174435 | A1 * | 7/2009 | Stan et al. | 326/112 |
| 2009/0181502 | A1 | 7/2009 | Parikh et al. | |
| 2009/0324897 | A1 | 12/2009 | Choi et al. | |
| 2010/0006823 | A1 * | 1/2010 | Anderson et al. | 257/24 |
| 2010/0025660 | A1 * | 2/2010 | Jain et al. | 257/24 |
| 2010/0102292 | A1 * | 4/2010 | Hiura et al. | 257/9 |

FOREIGN PATENT DOCUMENTS

| | | |
|---|---|---|
| JP | 2007335532 A | 12/2007 |
| JP | 2008105906 A | 5/2008 |
| JP | 2008205272 A | 9/2008 |
| JP | 2009-043939 A | 2/2009 |
| KR | 20090029621 A | 3/2009 |

* cited by examiner

*Primary Examiner* — Evan Pert
(74) *Attorney, Agent, or Firm* — Harness, Dickey & Pierce, P.L.C.

(57) ABSTRACT

Provided is a graphene device and a method of manufacturing the same. The graphene device may include an upper oxide layer on at least one embedded gate, and a graphene channel and a plurality of electrodes on the upper oxide layer. The at least one embedded gate may be formed on the substrate. The graphene channel may be formed on the plurality of electrodes, or the plurality of electrodes may be formed on the graphene channel.

29 Claims, 4 Drawing Sheets

GRAPHENE DEVICE AND METHOD OF MANUFACTURING THE SAME

CROSS-REFERENCE TO RELATED APPLICATIONS

This application claims priority under U.S.C. §119 to Korean Patent Application No. 10-2009-0098778, filed on Oct. 16, 2009, in the Korean Intellectual Property Office (KIPO), the entire contents of which are incorporated herein by reference.

BACKGROUND

1. Field

Example embodiments relate to a graphene device and a method of manufacturing the same.

2. Description of the Related Art

Recently, research on graphene that can be used instead of semiconductor devices has been widely conducted. Graphene is a zero gap semiconductor. When a graphene nano-ribbon (GNR) is formed to have a channel width less than about 10 nm, a band gap may be formed due to a size effect. Accordingly, a field effect transistor capable of operating at room temperature may be manufactured by using the GNR.

After the GNR is formed, an oxide layer having a thickness of about 300 nm may be formed thereon, and a global back gate may be formed on the oxide layer. However, coupling between the oxide layer and the global back gate may be relatively low, and accordingly, an operation voltage of the FET may increase. Also, if the processes of forming the oxide layer and a gate electrode on the oxide layer are used, a manufacturing process may be complicated, and thus, the properties of graphene may change.

SUMMARY

Example embodiments provide a graphene device that may be manufactured using a relatively simple process that facilitates operation control and does not affect the properties of the graphene device and a method of manufacturing the graphene device.

Additional aspects will be set forth in part in the description which follows and, in part, will be apparent from the description, or may be learned by practice of example embodiments.

According to example embodiments, a graphene device may include at least one embedded gate on a substrate, an upper oxide layer on the at least one embedded gate and a graphene channel and a plurality of electrodes on the upper oxide layer.

The plurality of electrodes may be on the graphene channel and the graphene device may be an inverter. The graphene channel may be on and/or between the plurality of electrodes and may be spaced apart from the upper oxide layer. The plurality of electrodes may be three electrodes spaced apart on the graphene channel and the at least one embedded gate may be one embedded gate such that the graphene device operates as the inverter.

The graphene device may further include an insulating layer on the graphene channel and between the plurality of electrodes and at least one metal pattern on the insulating layer, the at least one metal pattern corresponding with the at least one embedded gate. The substrate may include a semiconductor substrate and an oxide layer which are sequentially stacked. The graphene channel may have a single layer, bi-layer, or multi-layer structure.

According to example embodiments, a method of manufacturing a graphene device may include forming at least one an embedded gate on a substrate, forming an upper oxide layer on the at least one embedded gate and forming a graphene channel and a plurality of electrodes on the upper oxide layer.

The plurality of electrodes may be formed on the graphene channel or the graphene channel may be formed on the plurality of electrodes. The graphene channel may also be formed on the upper oxide layer between the plurality of electrodes. A graphene layer may be formed and then deposited on the upper oxide layer to form the graphene channel. The plurality of electrodes may be three electrodes, and the at least one embedded gate may be one embedded gate. The method may further include forming an insulating layer between the plurality of electrodes on the graphene channel and forming at least one metal pattern on the insulating layer, the at least one metal pattern corresponding with the at least one embedded gate. The graphene channel may be formed by depositing a single layer, bi-layer, or multi-layer graphene and the graphene device may be an inverter.

According to example embodiments, a method of operating a graphene device may include providing a graphene channel and a plurality of electrodes on at least one embedded gate and a metal pattern between the plurality of electrodes, the at least one metal pattern corresponding with the at least one embedded gate and applying different voltages to at least two of the plurality of electrodes and the metal pattern, respectively.

The voltage applied to one of the plurality of electrodes may be a VDD voltage and the voltage applied to another of the plurality of electrodes may be a ground voltage. The graphene channel may be an N-type or P-type channel, and if the graphene channel is an N-type channel, the voltage applied to the metal pattern may be a negative voltage.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
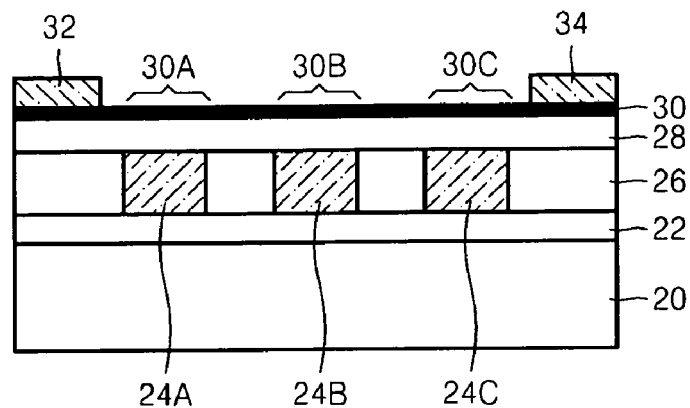
FIGS. 1 through 5 are cross-sectional views illustrating a graphene device according to example embodiments.

Hereinafter, a graphene device and a method of manufacturing the same according to example embodiments will be described in detail by explanation with reference to the attached drawings. In the drawings, the thicknesses of layers and regions are exaggerated for clarity. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 5 are cross-sectional views illustrating a graphene device according to example embodiments. Referring to FIG. 1, a lower oxide layer 22 may be formed on a substrate 20 to cover an upper surface of the substrate 20. The substrate 20 may be a silicon substrate or another substrate. The lower oxide layer 22 may be a buffer layer for forming an electrode. The lower oxide layer 22 may be a silicon oxide layer or another oxide layer. For example, the lower oxide layer 22 may be an oxide layer including another material except silicon, or alternatively, may be an oxide layer including silicon and another material.

First through third metal patterns 24A, 24B, and 24C may be formed spaced apart from one another on the lower oxide layer 22. The number of metal patterns may vary, for example, three or more, or three or less. The first through third metal patterns 24A, 24B, and 24C may be gate electrodes formed of TiN. Alternatively, the first through third metal patterns 24A, 24B, and 24C may be formed of a conventional material that may be used as a gate electrode. The first through third metal patterns 24A, 24B, and 24C may be a single layer or a multi-layer. An interlayer insulating layer 26 surrounding the first through third metal patterns 24A, 24B, and 24C may be formed on the lower oxide layer 22. Thus, the first through third metal patterns 24A, 24B, and 24C may be embedded in the interlayer insulating layer 26.

The interlayer insulating layer 26 may have the same height as the first through third metal patterns 24A, 24B, and 24C. Thus, the interlayer insulating layer 26 and the first through third metal patterns 24A, 24B, and 24C may form a flat surface. The interlayer insulating layer 26 may be a silicon oxide layer or another insulating layer.

As such, a plurality of gate electrodes (not shown) embedded in the interlayer insulating layer 26 may be formed under a graphene channel, and thus, a graphene device including a plurality of gate electrodes that are independently controlled may be formed, thereby facilitating the control of the graphene device.

An upper oxide layer 28 covering the first through third metal patterns 24A, 24B, and 24C may be formed on the interlayer insulating layer 26. The upper oxide layer 28 may be an aluminum oxide layer or another oxide layer. Alternatively, the upper oxide layer 28 may be formed of the same material as the lower oxide layer 22. The upper oxide layer 28 may have a thickness of about 20 nm or less. A graphene channel 30 formed with a graphene layer may be formed on the upper oxide layer 28. The graphene channel 30 may have a single-layer, bi-layer, or multi-layer structure. The graphene channel 30 may have a multi-layer structure as long as the graphene channel 30 is not a metal layer. First and second electrodes 32 and 34 may be formed on the graphene channel 30. One of the first and second electrodes 32 and 34 is a source electrode, and the other is a drain electrode. The first electrode 32 may be formed on one end of the graphene channel 30, and the second electrode 34 may be disposed on other end of the graphene channel 30.

The first through third metal patterns 24A, 24B, and 24C may be formed between the first electrode 32 and the second electrode 34. The first and second electrodes 32 and 34 are spaced apart from the first through third metal patterns 24A, 24B, and 24C. A first portion 30A facing an upper surface of the first metal pattern 24A of the graphene channel 30 may be a P-type or an N-type according to a voltage applied to the first metal pattern 24A. For example, when the voltage applied to the first metal pattern 24A is a positive voltage +V, the first portion 30A of the graphene channel 30 may be an N-type. A second portion 30B facing an upper surface of the second metal pattern 24B of the graphene channel 30 may be of a P-type or an N-type according to a voltage applied to the second metal pattern 24B.

For example, when the voltage applied to the second metal pattern 24B is a negative voltage −V, the second portion 30B of the graphene channel 30 may be a P-type. Also, a third portion 30C facing an upper surface of the third metal pattern 24C of the graphene channel 30 may be a P-type or an N-type according to a voltage applied to the third metal pattern 24C. For example, when the voltage applied to the third metal pattern 24C is a positive voltage +V, the third portion 30C may be an N-type. Accordingly, the graphene device of FIG. 1 may be one selected from the group consisting of PPP, PPN, PNP, NPP, NPN, NNP, PNN, and NNN types.

Figure 2:
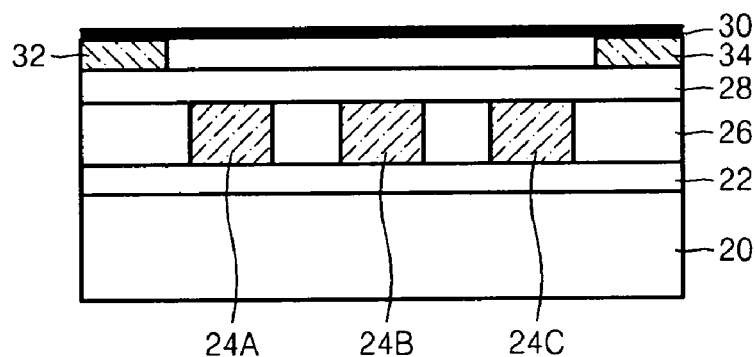
Figure 3:
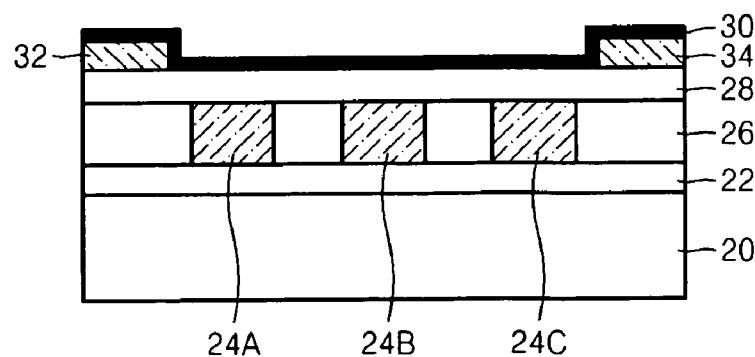

The graphene channel 30 may be formed on the first and second electrodes 32 and 34, as illustrated in FIG. 2. In detail, one end of the graphene channel 30 may be formed on an upper surface of one of the first and second electrodes 32 and 34, and other end of the graphene channel 30 may be formed on an upper surface of the other of the first and second electrodes 32 and 34. That is, the graphene channel 30 may be supported by the first and second electrodes 32 and 34. The graphene channel 30 may also be formed on the upper oxide layer 28 disposed between the first and second electrodes 32 and 34, as illustrated in FIG. 3, and may extend on the first and second electrodes 32 and 34 along surfaces thereof.

Figure 4:
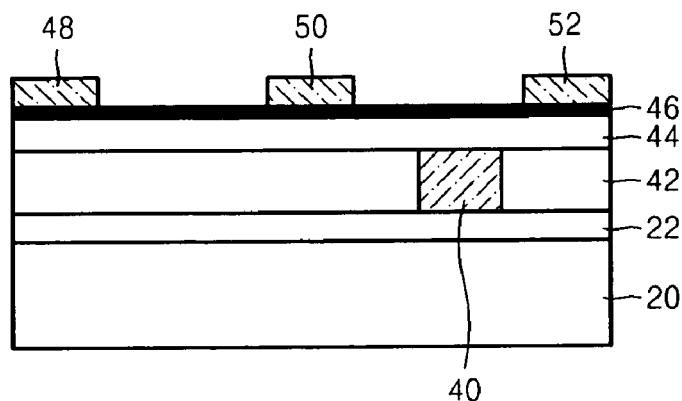

FIG. 4 illustrates a graphene-based inverter as an example of a graphene device, according to example embodiments. Like reference numerals in the following description denote like elements in the previous description, and thus, they will not be explained again.

Referring to FIG. 4, a lower oxide layer 22 may be formed on a substrate 20. A fourth metal pattern 40 may be formed on the lower oxide layer 22. The fourth metal pattern 40 may be a gate electrode. The fourth metal pattern 40 may be formed of the same material as the first through third metal patterns 24A, 24B, and 24C of FIG. 1. An interlayer insulating layer 42 surrounding the fourth metal pattern 40 may be formed on the lower oxide layer 22. The interlayer insulating layer 42 may have the same height as the fourth metal pattern 40. Accordingly, an upper surface of the fourth metal pattern 40 and an upper surface of the interlayer insulating layer 42 may form a flat surface. The interlayer insulating layer 42 may be the same as the interlayer insulating layer 26 of FIG. 1.

An upper oxide layer 44 covering the upper surface of the fourth metal pattern 40 may be formed on the interlayer insulating layer 42. The upper oxide layer 44 may be the same as the upper oxide layer 28 of FIG. 1. A graphene channel 46 may be formed on the upper oxide layer 44. The graphene channel 46 may be the same as the graphene channel 30 of FIG. 1. The graphene channel 46 may be a P-type or an N-type. Third through fifth electrodes 48, 50, and 52 may be formed on the graphene channel 46. The fourth metal pattern 40 may be formed between the fourth electrode 50 and the fifth electrode 52. To operate the inverter, a VDD may be applied to the third electrode 48, and a ground voltage may be applied to the fifth electrode 52. When the graphene channel 46 is an N-type, a negative voltage −V may be applied to the fourth metal pattern 40. In example embodiments, a portion between the fourth electrode 50 and the fifth electrode 52 of the graphene channel 46 may be a P-type.

The inverter of FIG. 4 may be operated as follows. If R1 is a resistance of the graphene channel 46 between the third electrode 48 and the fourth electrode 50 and R2 is a resistance of the graphene channel 46 between the fourth electrode 50 and the fifth electrode 52, a voltage Vout applied to the fourth electrode 50 is Vout=VDD*(1/(1+R1/R2)). A voltage +Vin may be applied to the fourth metal pattern 40, R2=R1−ΔR, and a voltage Vin may be applied to the fourth metal pattern 40, R2=R1+ΔR, where ΔR is difference between R1 and R2. Accordingly, Vout(−Vin) is larger than Vout(Vin), that is, Vout(−Vin)>Vout(Vin), and thereby, an inverter may be embodied. The Vout (Vin) denotes a voltage applied to the fourth electrode 50 when a voltage +Vin is applied to the fourth metal pattern 40. The Vout (−Vin) denotes a voltage applied to the fourth electrode 50 when a voltage −Vin is applied to the fourth metal pattern 40.

Figure 5:
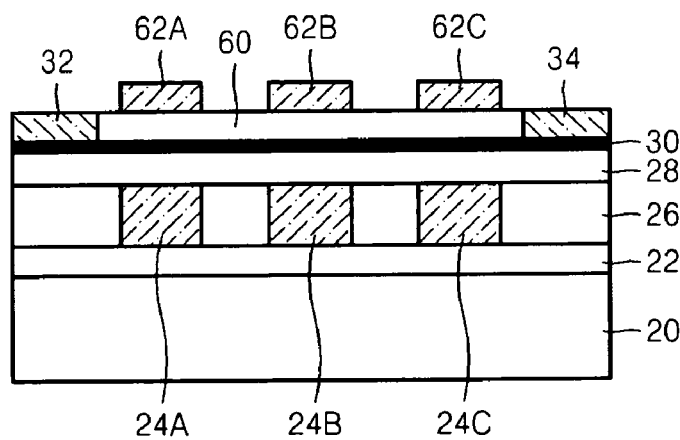

FIG. 5 illustrates a graphene device according to example embodiments. Referring to FIG. 5, a lower oxide layer 22 may be formed on a substrate 20. First through third metal patterns 24A, 24B, and 24C may be formed spaced apart from one another on the lower oxide layer 22. An interlayer insulating layer 26 surrounding the first through third metal patterns 24A, 24B, and 24C may be formed on the lower oxide layer 22. An upper oxide layer 28 covering upper surfaces of the first through third metal patterns 24A, 24B, and 24C may be formed on the interlayer insulating layer 26. A graphene channel 30 may be formed on the upper oxide layer 28. The graphene channel 30 may be a bi-layer channel. First and second electrodes 32 and 34 spaced apart from each other may be formed on the graphene channel 30.

The graphene channel 30 between the first electrode 32 and the second electrode 34 may be covered by an insulating layer 60. The insulating layer 60 may be formed of the same material as the upper oxide layer 28. The insulating layer 60 may have a thickness of about 20 nm or less. The thickness of the insulating layer 60 may be the same as that of the upper oxide layer 28. Fifth through seventh metal patterns 62A, 62B, and 62C may be formed on the insulating layer 60. The fifth through seventh metal patterns 62A, 62B, and 62C may be formed on the first through third metal patterns 24A, 24B, and 24C, respectively, to correspond to each other.

When a predetermined or given voltage is applied to the first through third metal patterns 24A, 24B, and 24C and the fifth through seventh metal patterns 62A, 62B, and 62C, a band gap of the graphene channel 30 between the metal patterns disposed one above the other may be controlled. For example, if a potential difference between the first metal pattern 24A and the fifth metal pattern 62A is greater than that between the second metal pattern 24B and the sixth metal pattern 62B, a band gap of the graphene channel 30 disposed between the first metal pattern 24A and the fifth metal pattern 62A may be greater than that of the graphene channel 30 disposed between the second metal pattern 24B and the sixth metal pattern 62B. As an example, a voltage of −2V may be applied to the first metal pattern 24A, a voltage of +2V may be applied to the fifth metal pattern 62A, a voltage of −1V may be applied to the second metal pattern 24B, and a voltage of +1V may be applied to the sixth metal pattern 62B.

Figure 6:
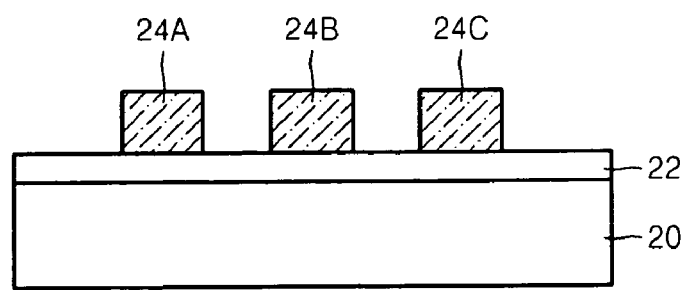
FIGS. 6 through 11 are cross-sectional views illustrating a method of manufacturing a graphene device according to example embodiments.

A method of manufacturing a graphene device according to example embodiments will now be described with reference to FIGS. 6 through 11. Referring to FIG. 6, a lower oxide layer 22 may be formed on a substrate 20. First through third metal patterns 24A, 24B, and 24C may be formed on the lower oxide layer 22. The first through third metal patterns 24A, 24B, and 24C may be formed by forming a metal layer (not shown) on the lower oxide layer 22 and etching the metal layer using a predetermined or given etching process, for example, a reactive ion etching (RIE) method. The metal layer may be etched using another etching method. The metal layer may be formed of TiN using a chemical vapor deposition (CVD) method or using another method. A manufacturing process may be simplified by forming the first through third metal patterns 24A, 24B, and 24C, that is, gate electrodes before forming a graphene channel.

Figure 7:
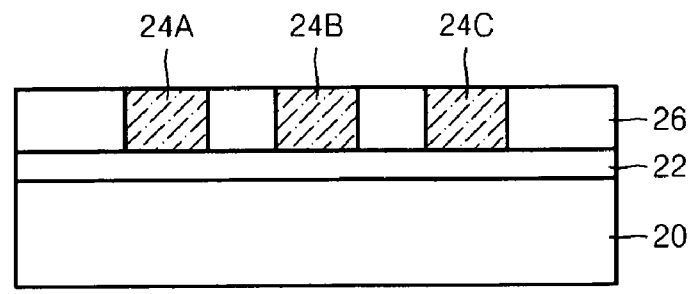

Referring to FIG. 7, an interlayer insulating layer 26 surrounding the first through third metal patterns 24A, 24B, and 24C may be formed on the lower oxide layer 22. The interlayer insulating layer 26 may be formed of a silicon oxide layer or other insulating material or oxide. The interlayer insulating layer 26 may be formed by forming an insulating layer (not shown) covering the first through third metal patterns 24A, 24B, and 24C on the lower oxide layer 22 and etching an upper surface of the insulating layer until the first through third metal patterns 24A, 24B, and 24C are exposed. Such an etching process may be performed by etchback or chemical mechanical polishing (CMP). The insulating layer may be formed by plasma enhanced CVD (PECVD), but may be formed using another depositing method.

The first through third metal patterns 24A, 24B, and 24C may be embedded in the interlayer insulating layer 26 before a graphene channel is formed, and thus, change of properties of graphene that may occur when a graphene channel is formed before forming the gate electrodes may be prevented or reduced.

Figure 8:
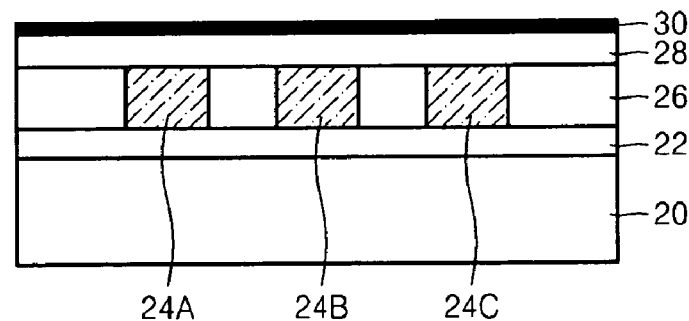

Referring to FIG. 8, an upper oxide layer 28 covering the first through third metal patterns 24A, 24B, and 24C may be formed on the interlayer insulating layer 26. The upper oxide layer 28 may be formed of an aluminum oxide layer and may have a thickness of about 20 nm or less. However, the thickness of the upper oxide layer 28 may be controlled as needed. A graphene channel 30 may be formed on the upper oxide layer 28. A graphene layer may be formed independently, and the graphene layer may be transferred on the upper oxide layer 28 to form the graphene channel 30. The transferred graphene layer may be a CVD graphene or a flake sample. The graphene channel 30 may have a single layer, bi-layer, or multi-layer structure.

Figure 9:
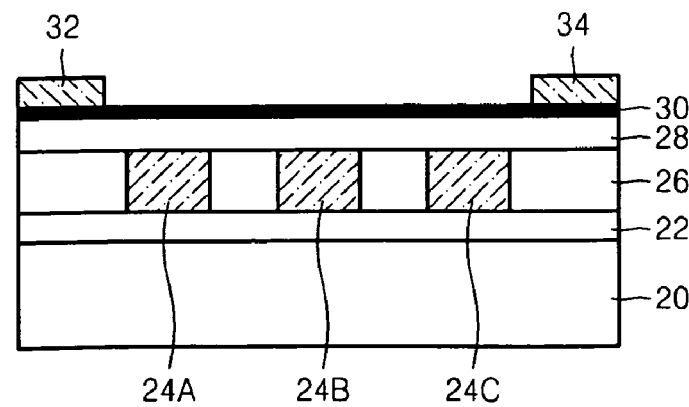

After the upper oxide layer 28 is formed, first and second electrodes 32 and 34 may be formed spaced apart from each other on the first and second electrodes 32 and 34, as illustrated in FIG. 9. The first and second electrodes 32 and 34 may be located outside of the first through third metal patterns 24A, 24B, and 24C.

Figure 10:
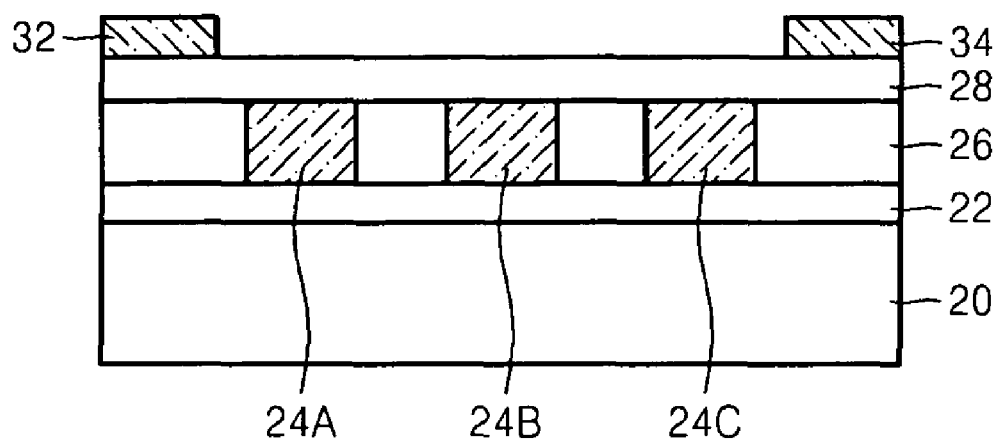
Figure 11:
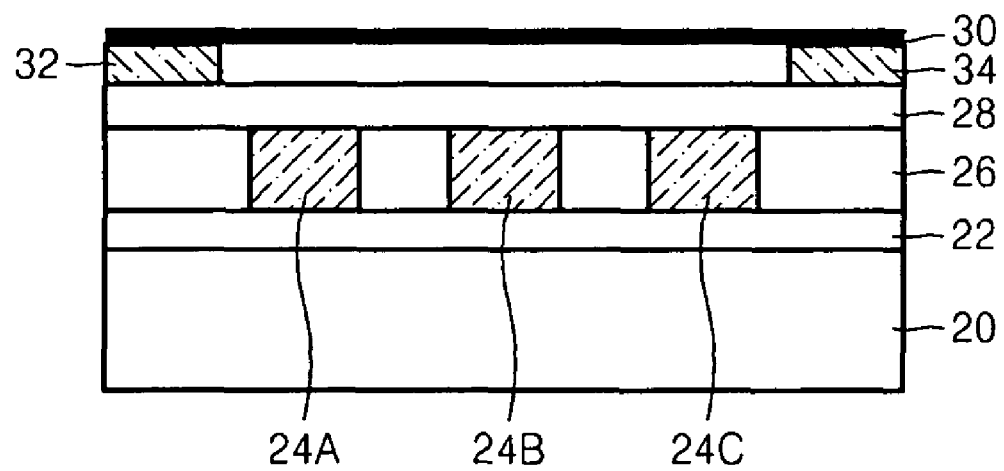

After the upper oxide layer 28 is formed, the first and second electrodes 32 and 34 may be first formed on the upper oxide layer 28, as illustrated in FIG. 10. As illustrated in FIG. 11, the graphene channel 30 may be transferred on the first and second electrodes 32 and 34. In example embodiments, ends of the graphene channel 30 are placed on the first and second electrodes 32 and 34. Thus, the graphene channel 30 may be supported by the first and second electrodes 32 and 34. The inverter of FIG. 4 and the graphene device of FIG. 5 may be manufactured using a manufacturing method illustrated in FIGS. 6 through 9.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:
1. A graphene device comprising:
   at least one embedded gate on a substrate;
   an upper oxide layer on the at least one embedded gate; and
   a graphene channel and a plurality of electrodes on the upper oxide layer, the plurality of electrodes including a source electrode and a drain electrode,
   wherein the at least one embedded gate does not overlap with the source electrode and the drain electrode.
2. The graphene device of claim 1, wherein the plurality of electrodes are on the graphene channel.
3. The graphene device of claim 2, wherein the graphene device is an inverter.
4. The graphene device of claim 1, wherein the graphene channel is on the plurality of electrodes.
5. The graphene device of claim 1, wherein the graphene channel is on and between the plurality of electrodes.
6. The graphene device of claim 3, wherein the graphene channel is spaced apart from the upper oxide layer.
7. The graphene device of claim 3, wherein the plurality of electrodes are three electrodes spaced apart on the graphene channel and the at least one embedded gate is one embedded gate such that the graphene device operates as the inverter.
8. The graphene device of claim 2, further comprising:
   an insulating layer on the graphene channel and between the plurality of electrodes; and
   at least one metal pattern on the insulating layer, the at least one metal pattern corresponding with the at least one embedded gate.
9. The graphene device of claim 1, wherein the substrate includes a semiconductor substrate and an oxide layer which are sequentially stacked.
10. The graphene device of claim 2, wherein the graphene channel has a single layer, bi-layer, or multi-layer structure.
11. The graphene device of claim 4, wherein the graphene channel has a single layer, bi-layer, or multi-layer structure.
12. The graphene device of claim 8, wherein the graphene channel has a bi-layer structure.
13. A method of manufacturing a graphene device, comprising:
   forming at least one an embedded gate on a substrate;
   forming an upper oxide layer on the at least one embedded gate; and
   forming a graphene channel and a plurality of electrodes on the upper oxide layer, the plurality of electrodes including a source electrode and a drain electrode,
   wherein the at least one embedded gate is formed on the substrate such that the at least one embedded gate does not overlap with the source electrode and the drain electrode.
14. The method of claim 13, wherein the plurality of electrodes are formed on the graphene channel.
15. The method of claim 13, wherein the graphene channel is formed on the plurality of electrodes.
16. The method of claim 13, wherein the graphene channel is formed on the plurality of electrodes and on the upper oxide layer between the plurality of electrodes.
17. The method of claim 14, wherein a graphene layer is formed and then deposited on the upper oxide layer to form the graphene channel.
18. The method of claim 15, wherein a graphene layer is formed and then deposited on the upper oxide layer to form the graphene channel.
19. The method of claim 16, wherein a graphene layer is formed and then deposited on the upper oxide layer to form the graphene channel.
20. The method of claim 14, wherein the plurality of electrodes are three electrodes, and the at least one embedded gate is one embedded gate.
21. The method of claim 14, further comprising:
   forming an insulating layer between the plurality of electrodes on the graphene channel; and forming at least one metal pattern on the insulating layer, the at least one metal pattern corresponding with the at least one embedded gate.

22. The method of claim 14, wherein the graphene channel is formed by depositing a single layer, bi-layer, or multi-layer graphene.

23. The method of claim 15, wherein the graphene channel is formed by depositing a single layer, bi-layer, or multi-layer graphene.

24. The method of claim 21, wherein the graphene channel is formed by depositing a bi-layer graphene.

25. The method of claim 13, wherein the graphene device is an inverter.

26. A method of operating a graphene device comprising:
   providing a graphene channel and a plurality of electrodes on at least one embedded gate and at least one metal pattern between the plurality of electrodes, the at least one metal pattern corresponding with the at least one embedded gate and the plurality of electrodes including a source electrode and a drain electrode; and
   applying different voltages to at least two of the plurality of electrodes and the metal pattern, respectively,
   wherein the at least one embedded gate is provided such that the at least one embedded gate does not overlap with the source electrode and the drain electrode.

27. The method of claim 26, wherein the voltage applied to one of the plurality of electrodes is a VDD voltage and the voltage applied to another of the plurality of electrodes is a ground voltage.

28. The method of claim 27, wherein the graphene channel is an N-type or P-type channel.

29. The method of claim 28, wherein the graphene channel is an N-type channel and the voltage applied to the metal pattern is a negative voltage.

* * * * *